United States Patent
Walde et al.

(10) Patent No.: US 9,673,028 B2
(45) Date of Patent: *Jun. 6, 2017

(54) ARC MANAGEMENT WITH VOLTAGE REVERSAL AND IMPROVED RECOVERY

(71) Applicant: Advanced Energy Industries, Inc., Fort Collins, CO (US)

(72) Inventors: Hendrik Walde, Fort Collins, CO (US); Joshua Brian Pankratz, Fort Collins, CO (US); David Christie, Fort Collins, CO (US); Brian D. Kowal, Fort Collins, CO (US)

(73) Assignee: ADVANCED ENERGY INDUSTRIES, INC., Fort Collins, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/095,745

(22) Filed: Apr. 11, 2016

(65) Prior Publication Data

US 2017/0025257 A1  Jan. 26, 2017

Related U.S. Application Data

(63) Continuation of application No. 14/012,847, filed on Aug. 28, 2013, now Pat. No. 9,313,870.

(51) Int. Cl.
*G05F 1/00* (2006.01)
*H01J 37/32* (2006.01)
(Continued)

(52) U.S. Cl.
CPC ........ *H01J 37/32944* (2013.01); *H01J 37/24* (2013.01); *H01J 37/244* (2013.01);
(Continued)

(58) Field of Classification Search
CPC ....... H05H 1/24; H05H 1/46; H01J 37/32082; H01J 37/32192
(Continued)

(56) References Cited

U.S. PATENT DOCUMENTS 6,483,678 B1   11/2002 Morita et al.
9,313,870 B2 *  4/2016 Walde ..................... H05H 1/24
(Continued)

FOREIGN PATENT DOCUMENTS

WO        2005001870 A2    1/2005

OTHER PUBLICATIONS

O'Dowd, Sean R., "Response to Office Action re U.S. Appl. No. 14/012,847", Nov. 30, 2015, p. 5, Published in: US.

(Continued)

*Primary Examiner* — Thomas Skibinski
(74) *Attorney, Agent, or Firm* — Neugeboren O'Dowd PC

(57) ABSTRACT

Systems and methods for arc handling in plasma processing operations are disclosed. The method includes providing current with a power supply to a plasma load at a first voltage polarity and energizing an energy storage device so when it is energized, the energy storage device applies a reverse polarity voltage that has a magnitude that is as least as great as the first voltage polarity. When an arc is detected, power is applied from the energy storage device to the plasma load with a reverse polarity voltage that has a polarity that is opposite of the first voltage polarity, the application of the reverse polarity voltage to the plasma load decreases a level of the current that is provided to the plasma load.

7 Claims, 6 Drawing Sheets

(51) Int. Cl.
*H05H 1/24* (2006.01)
*H05H 1/36* (2006.01)
*H05H 1/48* (2006.01)
*H01J 37/24* (2006.01)
*H01J 37/244* (2006.01)
*H05H 1/34* (2006.01)

(52) U.S. Cl.
CPC ............ *H05H 1/24* (2013.01); *H05H 1/36* (2013.01); *H05H 1/48* (2013.01); *H01J 2237/0206* (2013.01); *H01J 2237/244* (2013.01); *H05H 2001/3494* (2013.01)

(58) Field of Classification Search
USPC ....... 315/307–311, 291, 294, 111.01, 111.11, 315/111.21, 111.31, 111.41, 111.51, 315/111.61, 111.71, 111.81, 111.91
See application file for complete search history.

(56) References Cited

U.S. PATENT DOCUMENTS

2008/0061794 A1\* 3/2008 Pankratz ............ H01J 37/32064
324/536

2008/0143260 A1\* 6/2008 Tuymer ............ H01J 37/32091
315/111.21

2011/0303534 A1 12/2011 Yanagiya

OTHER PUBLICATIONS

Skibinski, Thomas S., "Office Action re U.S. Appl. No. 14/012,847", Aug. 28, 2015, p. 32, Published in: US.

Panta, Kusha, "International Search Report and Written Opinion re Application No. PCT/US2013/057130", Dec. 12, 2013, p. 9, Published in: AU.

Wittmann-Regis, Agnes, "Inernational Preliminary Report on Patentability re Application No. PCT/US2013/057130", Mar. 12, 2015, p. 6, Published in: CH.

De Ruijer-Noordman, "Supplementary European Search Report re Application No. 13832871," Dec. 30, 2015, p. 2, Published in: EP.

\* cited by examiner

ARC MANAGEMENT WITH VOLTAGE REVERSAL AND IMPROVED RECOVERY

PRIORITY

The present application for patent is a Continuation of patent application Ser. No. 14/012,847 entitled "ARC MANAGEMENT WITH VOLTAGE REVERSAL AND IMPROVED RECOVERY" filed Aug. 28, 2013, pending, which claims priority to Provisional Application No. 61/695,914 entitled "ARC MANAGEMENT WITH VOLTAGE REVERSAL AND IMPROVED RECOVERY" filed Aug. 31, 2012, and assigned to the assignee hereof and hereby expressly incorporated by reference herein.

FIELD OF THE INVENTION

This invention relates generally to power supplies for plasma processing applications, and more particularly to systems and methods to limit arcing therein.

BACKGROUND OF THE INVENTION

In plasma processing applications arcs are known to develop when a discharge occurs between a point on a cathode where charge has accumulated and a point on the anode. If not extinguished quickly, arcs can be very detrimental to the process and the quality of the processed film.

Past approaches to arc control in plasma processes have focused upon the reduction of energy supplied by a power supply into an arc. In some power supplies, arcs are extinguished by turning off after the arc is detected. In variations of these past approaches, a shunt switch is placed across the power supply and is used to circulate inductor current inside of the power supply, and when the arc is extinguished, the shunt switch opens. These types of systems are effective to some extent, but are unable to provide the expedient arc mitigation often necessary in present processing environments.

In some systems, a second-power supply is employed, so that during an arc event, power from the first-power supply is removed from the plasma chamber and power from the second-power supply is provided to the plasma chamber with a reverse polarity of the first-power supply. Although, these systems enable arcs to be extinguished relatively quickly, the second-power supply adds substantial cost to the system and substantially increases a risk of failure.

Another approach that has proven to be effective in plasma processing applications (e.g., where relatively low power and low current is utilized) includes employing a tapped inductor in series with an output of a power supply and a shunt switch. The tapped inductor acts as an autotransformer and provides a reverse voltage that is a function of the turn ratio of the tapped inductor. Tapped inductors that can handle higher currents and provide the desired low-leakage inductance, however, are relatively expensive. And implementing cable with a sufficiently low inductance is also costly—especially at higher currents.

Although present devices are functional for many applications, they are not sufficient for many implementations or are otherwise unsatisfactory. Accordingly, a system and method are needed to address the shortfalls of present technology and to provide other new and innovative features.

SUMMARY

Illustrative embodiments of the present disclosure that are shown in the drawings are summarized below. These and other embodiments are more fully described in the Detailed Description section. It is to be understood, however, that there is no intention to limit the disclosure to the forms described in this Summary or in the Detailed Description. One skilled in the art can recognize that there are numerous modifications, equivalents, and alternative constructions that fall within the spirit and scope of the disclosure as expressed in the claims.

According to one aspect, a method for arc management is provided. The method includes providing current with a power supply to a plasma load at a first voltage polarity; energizing an energy storage device so when it is energized, the energy storage device applies a reverse polarity voltage that has a magnitude that is as least as great as the first voltage polarity; applying, when an arc is detected, power from the energy storage device to the plasma load with a reverse polarity voltage that has a polarity that is opposite of the first voltage polarity, the application of the reverse polarity voltage to the plasma load decreases a level of the current that is provided to the plasma load; preventing the reverse polarity voltage from being applied to the plasma load if the current decreases to zero; and reapplying, after the arc is extinguished, power to the plasma load at the first voltage polarity to resume processing.

BRIEF DESCRIPTION OF DRAWING FIGURES

Various objects and advantages and a more complete understanding of the present disclosure are apparent and more readily appreciated by reference to the following Detailed Description and to the appended claims when taken in conjunction with the accompanying Drawings where like or similar elements are designated with identical reference numerals throughout the several views and wherein:

DETAILED DESCRIPTION

Figure 1:
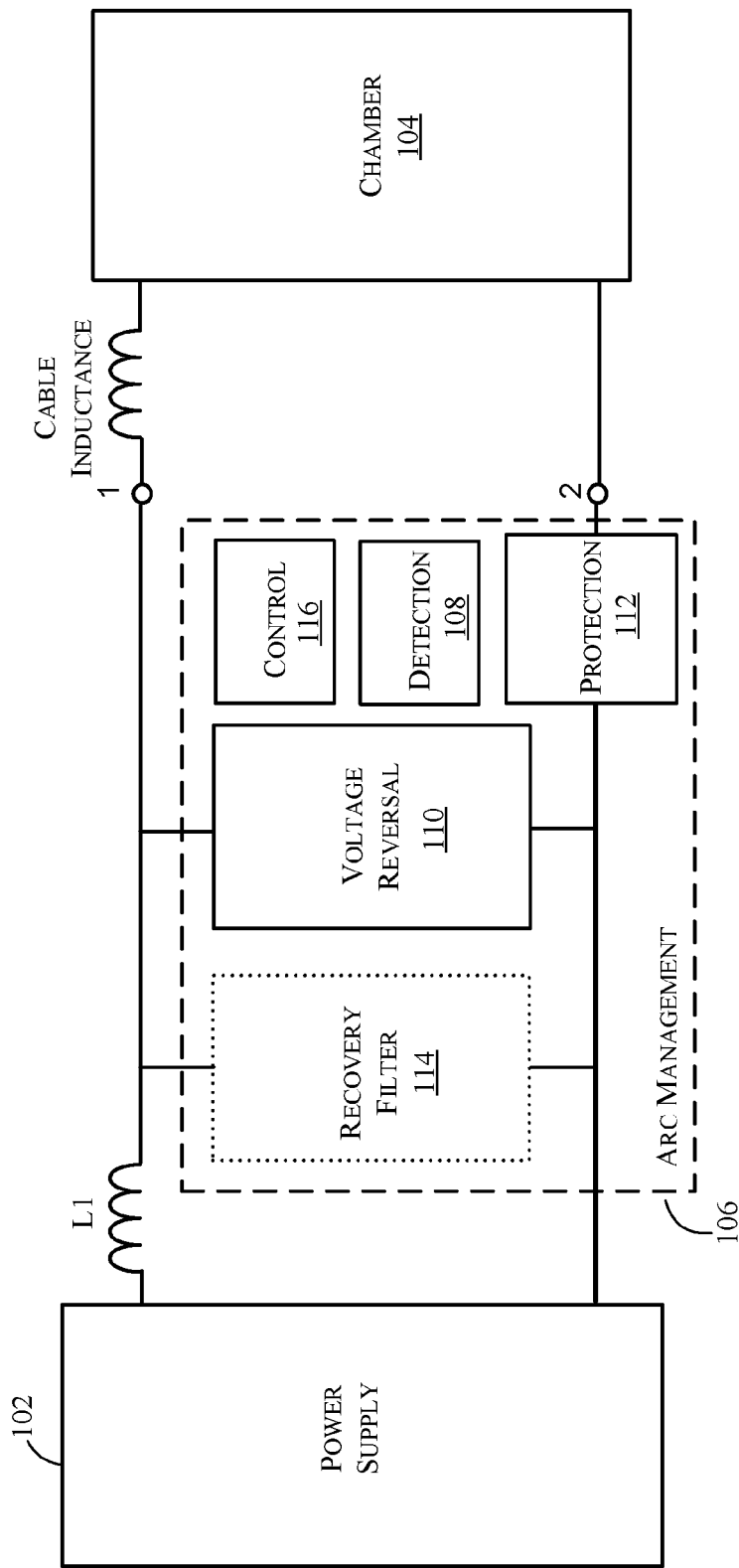
FIG. 1 is a block diagram depicting an exemplary embodiment of the invention.

Referring now to the drawings, where like or similar elements are designated with identical reference numerals throughout the several views, and referring in particular to FIG. 1, it illustrates a block diagram depicting an exemplary embodiment of the invention. Shown is a power supply 102 (e.g., a DC, pulse-width modulated voltage source) that is disposed to apply pulsed DC power to a plasma chamber 104 with a supply cable to facilitate any of a variety of plasma processing applications known to those of skill in the art. As depicted, the power supply 102 is also connected to arc management components 106, which may be implemented as part of an integrated unit (e.g., within the same housing) with the power supply 102.

As shown, the arc management components 106 include a detection component 108, a voltage reversal component 110, a protection component 112, an optional recovery filter 114, and a control portion 116. In general, the arc management components 106 function to quickly extinguish arcs that may occur within the chamber 104 during plasma processing. In addition, the arc management components 106 include elements, discussed further herein, to protect the plasma chamber 104 and facilitate a fast recovery. It should be recognized that the block diagram in FIG. 1 is intended to be a logical diagram to depict constituent functions of the arc management components 106. As a consequence, a physical implementation may differ in appearance from the depiction in FIG. 1. For example, the depicted functions may be implemented by shared components so that these discrete functions may not have corresponding discrete hardware or software constructs. Moreover, the depicted functional components may be realized by hardware and software components that are spatially distributed about a power supply.

As shown, the arc management components 106 include a voltage reversal component 110 that generally operates, in response to an arc being detected by the detection component 108, to apply a relatively high voltage at a polarity that is opposite of a polarity that is applied by the power supply 102 during plasma processing. In some instances for example, the voltage applied by the voltage reversal component 110 may be about the same voltage (with opposite polarity) as the voltage output by the power supply 102, but in other instances, the voltage reversal component 110 may apply higher voltages to facilitate even faster removal of energy from arcs in the plasma chamber 104.

Also shown is a protection component 112 that operates to prevent the relatively high reverse voltage that is imparted by the voltage reversal component 110 from being applied to a plasma load in the chamber 104 after current has dropped to zero (or near zero levels) in response to the application of the reverse voltage.

The optional recovery filter 114 generally operates to facilitate faster recovery after an arc shutdown event by stabilizing the voltage at the terminals 1, 2. The stabilization prevents false triggering of the detection component 108 during recovery that may occur, for example, in response to ringing.

The control component 116 generally functions to control operation of the arc management components 106 so that, as a whole, the arc management components 106 quickly respond to arcs, extinguish any arcs, and quickly recover from the arc handling events. As one of ordinary skill in the art will appreciate, the control component 116 may be realized by hardware, software in combination with hardware, firmware, or combinations thereof.

Figure 2:
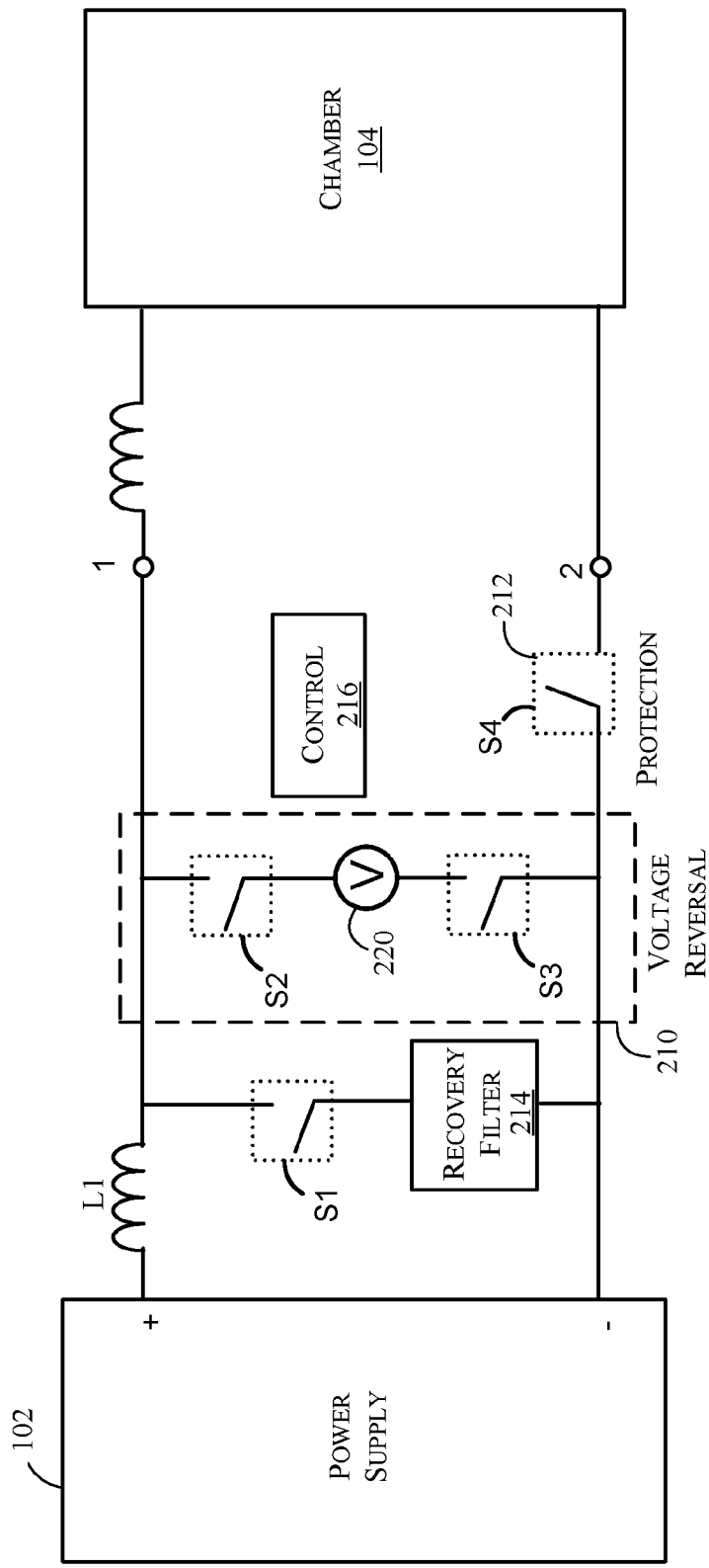
FIG. 2 is a diagram depicting more functional details of an exemplary embodiment.

Referring next to FIG. 2, it is a diagram depicting more functional details of an exemplary embodiment. As shown, the recovery filter 214 is in series with a switching element S1, and the series combination of the switching element S1 and the recovery filter is disposed across the positive and negative rails of the power supply 102. The voltage reversal component 210 in this embodiment is realized by a DC voltage source 220 that is interposed in series with switching elements S2 and S3, and the series combination of switching element S2, the DC voltage source 220, and switching element S3 is arranged across the positive and negative rails of the power supply. And in this embodiment, the protection component 212 is realized by a switching element S4.

For simplicity, details of an arc detection component 108 shown in FIG. 1 are not depicted in FIG. 2, but such detection mechanisms are well known in the art and can be achieved by various techniques. One exemplary technique to detect an arc is to monitor one or more aspects of the power at the terminals 1, 2 for indications of a change in an impedance of the plasma in the chamber 104. For example, it is known that the load impedance (of the plasma in the chamber 104) drops substantially (e.g., from around 50 Ohms to less than an Ohm) during an arc event. As a consequence, known techniques for arc detection include voltage and/or current monitoring because the voltage across the terminals 1,2 decreases and the current to the plasma load rises during an arc event.

Figure 3:
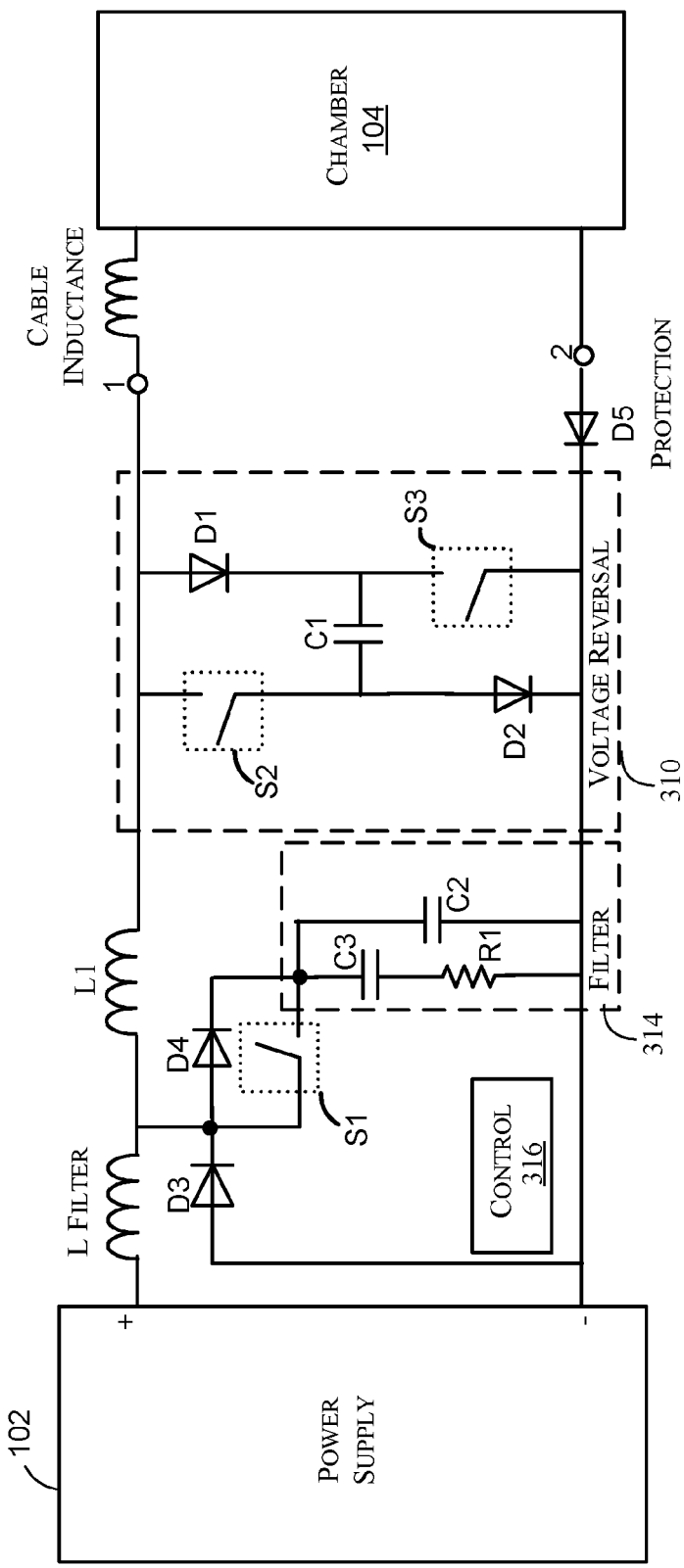
FIG. 3 is a diagram depicting a specific implementation of the embodiment depicted in FIG. 2.

FIG. 3 depicts a specific implementation of the embodiment depicted in FIG. 2, but it should be recognized that the specific implementation is only an exemplary implementation of the more general depiction in FIG. 2, and that alternative approaches may be utilized to realize the components in FIG. 2.

In the embodiment shown in FIG. 3, the DC voltage source 220 depicted in FIG. 2 is realized by an energy storage component depicted as capacitor C1 that is charged by the positive and negative rails of the power supply 102. The capacitor C1 in FIG. 3 is charged through diodes D1, D2, and as a consequence, the magnitude of the output voltage (e.g., 300 Volts to 1000 Volts) of the power supply 102 in this embodiment becomes the magnitude of the reverse voltage that is applied during arc handling. In an alternative embodiment, instead of charging the capacitor C1 with the positive and negative rails of the power supply 102, a higher charging voltage may be applied to the capacitor C1 using a transformer-boosted output of the power supply 102. Yet another alternative is to charge the capacitor C1 to a higher voltage with a separate power supply. A higher voltage applied to the capacitor C1 will result in the capacitor C1 applying a higher voltage reverse-polarity voltage to the chamber during arc handling.

As shown, the protection component 212 depicted in FIG. 2 is realized by a non-linear element (e.g., diode D5) in the embodiment depicted in FIG. 3, which operates as a switch that is current controlled so that as the load current approaches zero it opens. This prevents the large reverse arc handling voltage from being applied to chamber 104 as discussed further herein.

As depicted, the recovery filter 314 in this embodiment is realized by a series combination of C3 and R1 in parallel with C2, which is coupled to switching element S1. In operation, when an arc is detected and the voltage reversal module 310 is activating, the recovery filter 314 is detached from the circuit (e.g., by natural commutation of the anti parallel diode). When the arc-handling shutdown is complete and the plasma processing resumes, the switch S1 is activated and the recovery filter 314 is placed across the output to stabilize the output voltage. This prevents false triggering of the arc detection circuit during arc recovery.

Figure 4:
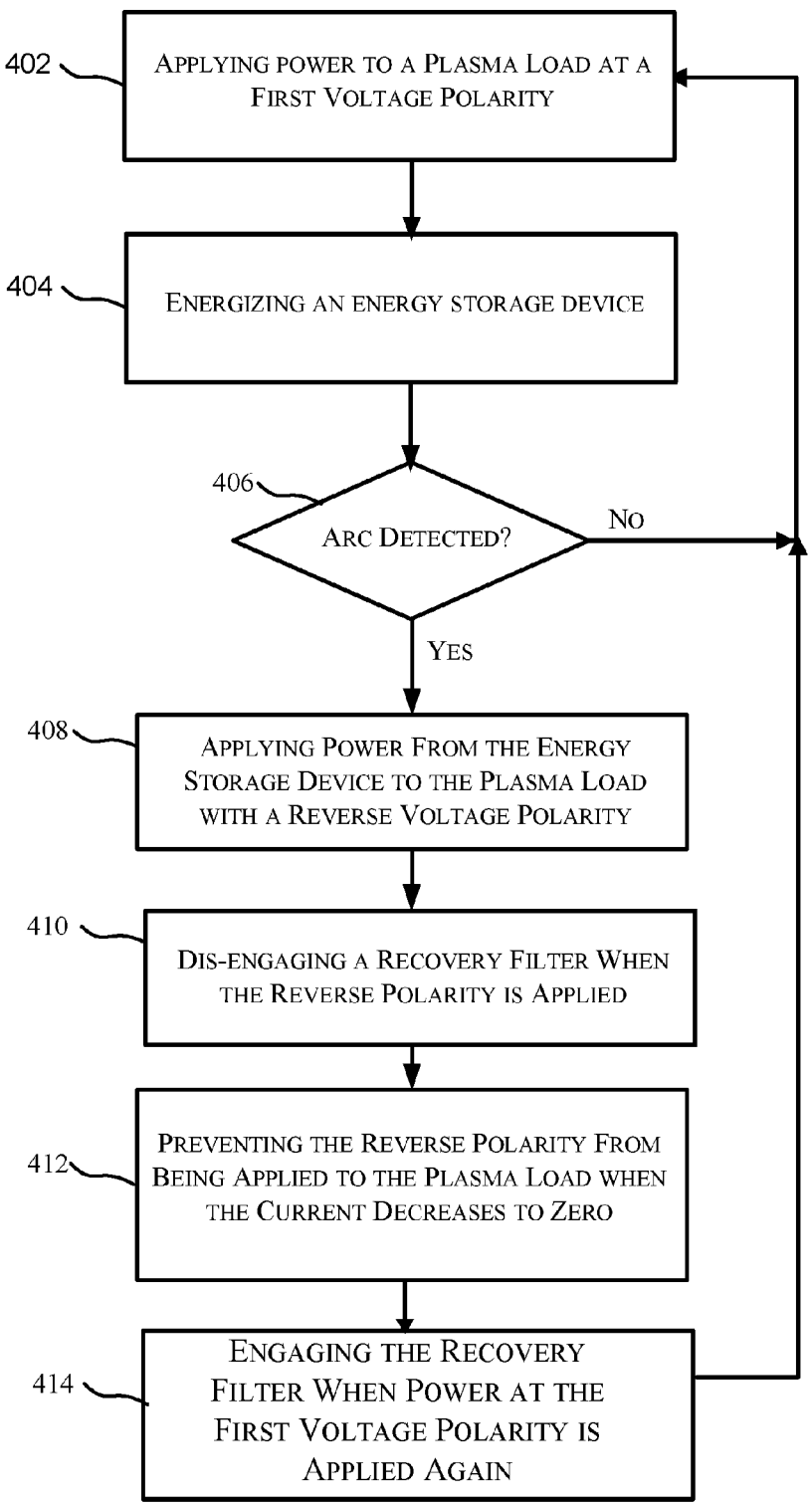
FIG. 4 is a flowchart depicting a method that may be traversed in connection with the embodiments described with reference to FIGS. 1-3.

Referring to FIG. 4, it is a flowchart depicting an exemplary method that may be traversed in connection with the embodiments described with reference to FIGS. 1-3. As shown, during typical processing of a workpiece in the plasma processing chamber 104, power is applied to the plasma load at a first voltage polarity (Block 402). During the application of power at the first polarity, an energy storage device (e.g., C1 in FIG. 3) is energized (Block 404). As depicted, when an arc is detected in the plasma chamber 104 (Block 406), to quickly remove power delivery to the arc, power is applied from the energy storage device (e.g., C1) to the plasma load with a reverse voltage polarity (reverse of the polarity that is applied during processing) (Block 408).

Figure 5:
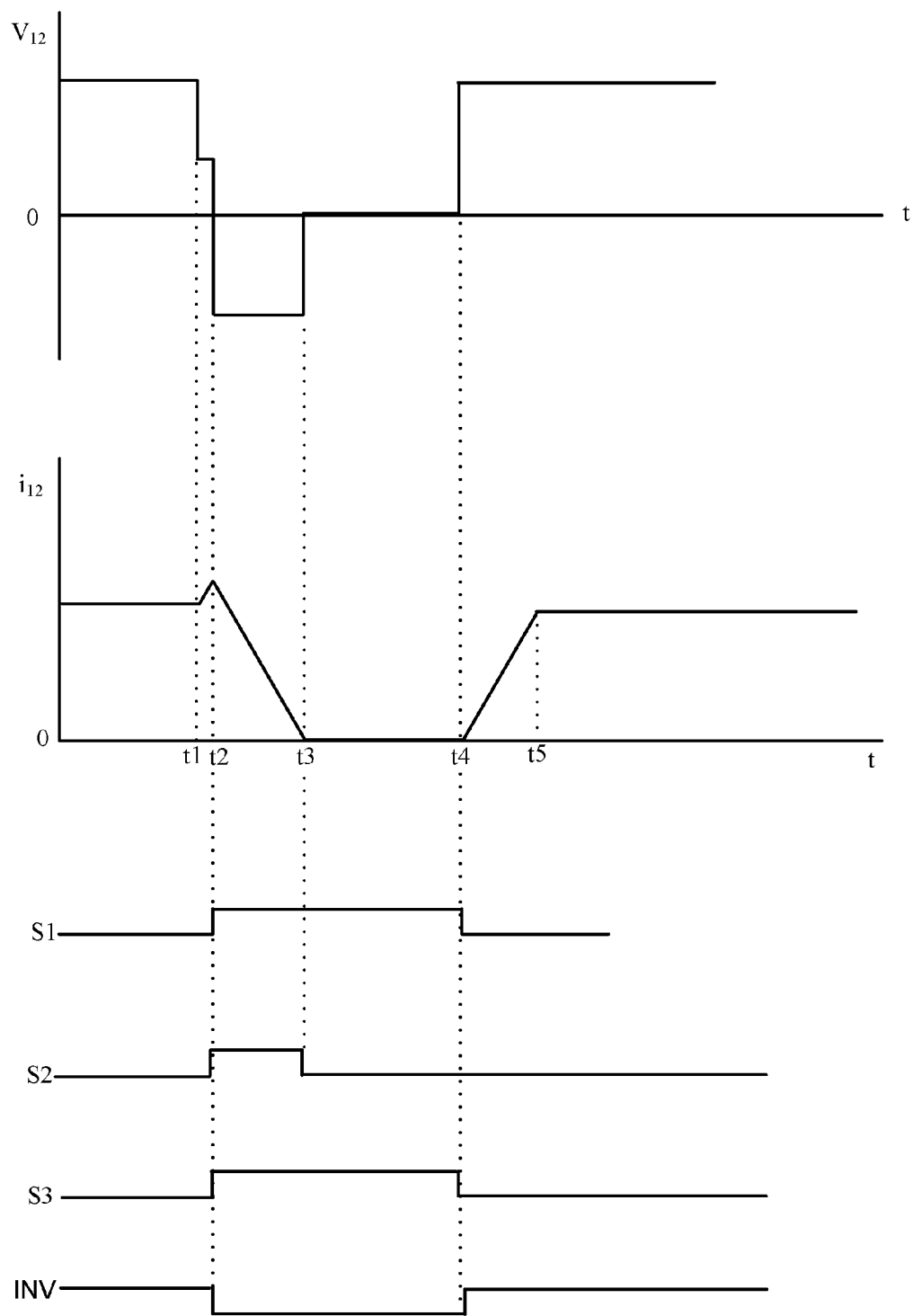
FIG. 5 is a timing diagram that depicts timing aspects of the embodiments disclosed herein.

Referring to FIG. 5, which is a timing diagram that depicts timing aspects of the embodiments disclosed herein, at time t1 an arc occurs, and at time t2, the control component 116, 216, 316 acts to reverse the polarity of the voltage that is applied to the plasma load by closing S2 and S3. And as a consequence, the current in the cable and plasma load is driven very fast to zero as depicted during the time from t2 to t3. It has been found that the application of a high reverse voltage (e.g., 300 to 1000 volts) may extinguish an arc in approximately one microsecond.

As shown in FIG. 4, when the arc is detected and the reverse voltage module is activated between times t2 and t3, the switching element S1, which is normally closed, is opened to detach the recovery filter 114, 214, 314 from the circuit (Block 410).

To prevent the high reverse voltage from adversely affecting the processing of a workpiece and potentially damaging the plasma chamber 104, the reverse polarity voltage is prevented from being applied to the plasma load when the current decreases to zero (Block 412). Referring again to FIG. 5 for example, at time t3 the load current is substantially zero and the switching element S4 effectively opens to prevent the application of the reverse voltage the chamber 104. In the embodiment depicted in FIG. 3, the self commutation of diode D5 prevents the reverse voltage from being "seen" at the plasma load, but the particular implementation of diode D5 is not required to effectuate the blocking of the high reverse voltage from reaching the plasma, and other mechanisms may also be utilized.

In one implementation, when an arc is extinguished and current is substantially zero, one of either switch S2 or S3 is opened, which removes the application of the reverse voltage to the chamber 104, and applies the relatively low saturation voltage of the remaining switch to the chamber 104 for a cooling period (shown as the time period t3 to t4 in FIG. 5) to prevent another arc from being initiated. After the cooling period (e.g., a programmable period of time), the remaining one of S2 or S3 that has not been opened is opened, and the power supply applies power again to the terminals 1, 2, and hence the chamber 104 (as depicted at time t4 in FIG. 5). During the exemplary arc handling event depicted in FIG. 5, switch S2 opens at time t3 and S3 remains closed, but during the next event, the roles of switches may change so that S2 remains closed from t3 to t4 and S3 opens at t3.

As shown in FIG. 4, once the power is applied again at the first polarity (at t4 in FIG. 5), the recovery filter is engaged to stabilize the output voltage (Block 414). This helps to prevent false triggering of the arc detection circuit during recovery as discussed above (e.g., during the period from t4 to t5).

Figure 6:
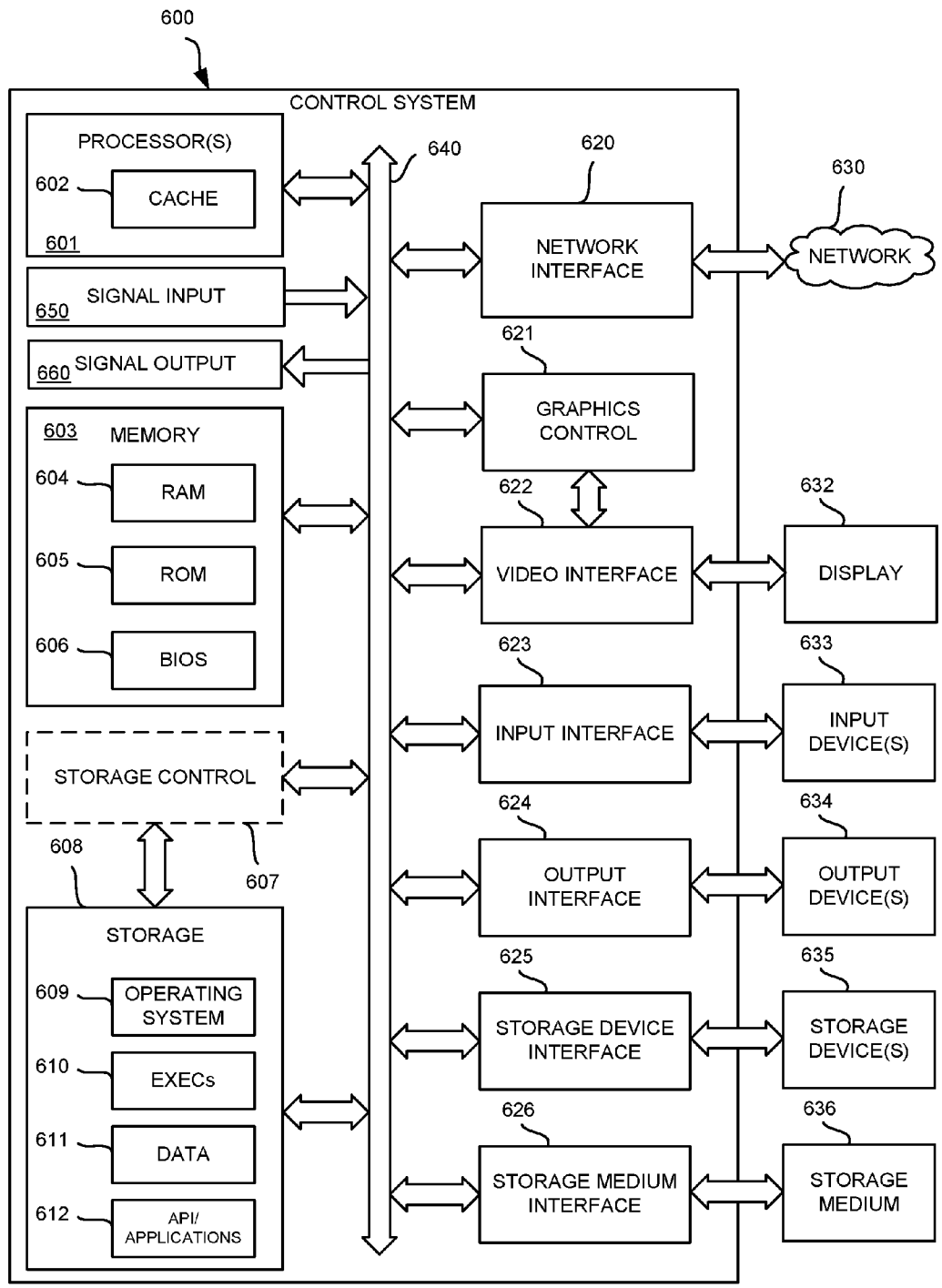
FIG. 6 shows a diagrammatic representation of one embodiment of a control system 600 within which a set of instructions can execute for causing a device to perform or execute any one or more of the aspects and/or methodologies of the present disclosure.

The systems and methods described herein can be implemented in connection with a control and processing components in addition to the specific physical devices previously described herein. FIG. 6 shows a diagrammatic representation of one embodiment of a control system 600 within which a set of instructions can execute for causing a device to perform or execute any one or more of the aspects and/or methodologies of the present disclosure. For example, the control system 600 may be utilized to realize the control component 116, 216, 316. But the components in FIG. 6 are examples only and do not limit the scope of use or functionality of any hardware, software, firmware, embedded logic component, or a combination of two or more such components implementing particular embodiments of this disclosure. Some or all of the illustrated components can be part of the control system 600. For instance, the control system 600 can include a general purpose computer or an embedded logic device (e.g., an FPGA), to name just two non-limiting examples.

Control system 600 in this embodiment includes at least a processor 601 such as a central processing unit (CPU) or an FPGA to name two non-limiting examples. The control system 600 may also comprise a memory 603 and storage 608, both communicating with each other, and with other components, via a bus 640. The bus 640 may also link a display 632, one or more input devices 633 (which may, for example, include a keypad, a keyboard, a mouse, a stylus, etc.), one or more output devices 634, one or more storage devices 635, and various non-transitory, tangible processor-readable storage media 636 with each other and with one or more of the processor 601, the memory 603, and the storage 608. All of these elements may interface directly or via one or more interfaces or adaptors to the bus 640. For instance, the various non-transitory, tangible processor-readable storage media 636 can interface with the bus 640 via storage medium interface 626. Control system 600 may have any suitable physical form, including but not limited to one or more integrated circuits (ICs), printed circuit boards (PCBs), mobile handheld devices, laptop or notebook computers, distributed computer systems, computing grids, or servers.

Processor(s) 601 (or central processing unit(s) (CPU(s))) optionally contains a cache memory unit 602 for temporary local storage of instructions, data, or processor addresses. Processor(s) 601 are configured to assist in execution of non-transitory processor-readable instructions stored on at least one non-transitory, tangible processor-readable storage medium. Control system 600 may provide functionality as a result of the processor(s) 601 executing instructions embodied in one or more non-transitory, tangible processor-readable storage media, such as memory 603, storage 608, storage devices 635, and/or storage medium 636 (e.g., read only memory (ROM)). For instance, instructions to effectuate one or more steps of the method described with reference to FIG. 4 may be embodied in one or more non-transitory, tangible processor-readable storage media and processor(s) 601 may execute the instructions. Memory 603 may read the instructions from one or more other non-transitory, tangible processor-readable storage media (such as mass storage device(s) 635, 636) or from one or more other sources through a suitable interface, such as network interface 620. Carrying out such processes or steps may include defining data structures stored in memory 603 and modifying the data structures as directed by the software.

The signal input component 650 generally operates to receive signals (e.g., digital and/or analog signals) that provide information about one or more aspects of the arc management component 106. In some implementations, arc detection component 108 may provide an output signal (e.g., a binary bit) to inform the control component when an arc is detected. In other implementations, the control system 600 may be utilized in part to realize the arc detection component 108. For example, arc detection component 108 may include voltage and/or current sensors (e.g., VI sensors, directional couplers, simple voltage sensors, or current transducers) that provide analog voltage signals, which are received and converted to digital signals by the signal input component 650.

The signal output component 660 may include digital-to-analog components known to those of ordinary skill in the art to generate switch control signals to control switches S1, S2, S3. When switches S1, S2, S3 are implemented as field effect transistors (FETs), for example, the signal output component 660 may generate gate drive signals to control the switches S1, S2, S3.

The memory 603 may include various components (e.g., non-transitory, tangible processor-readable storage media) including, but not limited to, a random access memory component (e.g., RAM 604) (e.g., a static RAM "SRAM", a dynamic RAM "DRAM", etc.), a read-only component (e.g., ROM 605), and any combinations thereof. ROM 605 may act to communicate data and instructions unidirectionally to processor(s) 601, and RAM 604 may act to communicate data and instructions bidirectionally with processor(s) 601. ROM 605 and RAM 604 may include any suitable non-transitory, tangible processor-readable storage media described below. In some instances, ROM 605 and RAM 604 include non-transitory, tangible processor-readable storage media for carrying out the methods described herein.

Fixed storage 608 is connected bidirectionally to processor(s) 601, optionally through storage control unit 607. Fixed storage 608 provides additional data storage capacity and may also include any suitable non-transitory, tangible processor-readable media described herein. Storage 608 may be used to store operating system 609, EXECs 610 (executables), data 611, API applications 612 (application programs), and the like. Often, although not always, storage 608 is a secondary storage medium (such as a hard disk) that is slower than primary storage (e.g., memory 603). Storage 608 can also include an optical disk drive, a solid-state memory device (e.g., flash-based systems), or a combination of any of the above. Information in storage 608 may, in appropriate cases, be incorporated as virtual memory in memory 603.

In one example, storage device(s) 635 may be removably interfaced with control system 600 (e.g., via an external port connector (not shown)) via a storage device interface 625. Particularly, storage device(s) 635 and an associated machine-readable medium may provide nonvolatile and/or volatile storage of machine-readable instructions, data structures, program modules, and/or other data for the control system 600. In one example, software may reside, completely or partially, within a machine-readable medium on storage device(s) 635. In another example, software may reside, completely or partially, within processor(s) 601.

Bus 640 connects a wide variety of subsystems. Herein, reference to a bus may encompass one or more digital signal lines serving a common function, where appropriate. Bus 640 may be any of several types of bus structures including, but not limited to, a memory bus, a memory controller, a peripheral bus, a local bus, and any combinations thereof, using any of a variety of bus architectures. As an example and not by way of limitation, such architectures include an Industry Standard Architecture (ISA) bus, an Enhanced ISA (EISA) bus, a Micro Channel Architecture (MCA) bus, a Video Electronics Standards Association local bus (VLB), a Peripheral Component Interconnect (PCI) bus, a PCI-Express (PCI-X) bus, an Accelerated Graphics Port (AGP) bus, HyperTransport (HTX) bus, serial advanced technology attachment (SATA) bus, and any combinations thereof.

Control system 600 may also include an input device 633. In one example, a user of control system 600 may enter commands and/or other information into control system 600 via input device(s) 633. Examples of an input device(s) 633 include, but are not limited to, a touch screen, an alphanumeric input device (e.g., a keyboard), a pointing device (e.g., a mouse or touchpad), a touchpad, a joystick, a gamepad, an audio input device (e.g., a microphone, a voice response system, etc.), an optical scanner, a video or still image capture device (e.g., a camera), and any combinations thereof. Input device(s) 633 may be interfaced to bus 640 via any of a variety of input interfaces 623 (e.g., input interface 623) including, but not limited to, serial, parallel, game port, USB, FIREWIRE, THUNDERBOLT, or any combination of the above.

Information and data can be displayed through a display 632. Examples of a display 632 include, but are not limited to, a liquid crystal display (LCD), an organic liquid crystal display (OLED), a cathode ray tube (CRT), a plasma display, and any combinations thereof. The display 632 can interface to the processor(s) 601, memory 603, and fixed storage 608, as well as other devices, such as input device(s) 633, via the bus 640. The display 632 is linked to the bus 640 via a video interface 622, and transport of data between the display 632 and the bus 640 can be controlled via the graphics control 621.

In addition or as an alternative, control system 600 may provide functionality as a result of logic hardwired or otherwise embodied in a circuit, which may operate in place of or together with software to execute one or more processes or one or more steps of one or more processes described or illustrated herein. Moreover, reference to a non-transitory, tangible processor-readable medium may encompass a circuit (such as an IC) storing instructions for execution, a circuit embodying logic for execution, or both, where appropriate. The present disclosure encompasses any suitable combination of hardware in connection with software.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In conclusion, the present invention provides, among other things, a system and method for arc-handling during plasma processing. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:
1. An apparatus for arc handling, comprising:
   a positive rail and a negative rail that are disposed to form an electrical link between a plasma chamber and a positive output and a negative output, respectively, of a power supply;
   an arc detection component to detect an occurrence of an arc in the plasma chamber;
   a voltage reversal component coupled across the positive rail and the negative rail, the voltage reversal component including:

an energy storage component disposed between a first and second switches, the first switch is coupled to the positive rail and a first terminal of the energy storage component and the second switch is coupled between the negative rail and a second terminal of the energy storage component; and a control component that is coupled to the arc detection component and the first and second switches of the voltage reversal component, the control component closes the first and second switches when an arc is detected to apply a negative potential of the energy storage component to the positive rail and a positive potential of the energy storage component to the negative rail.

2. The apparatus of claim 1, including:
a charging-power supply to charge the energy storage device to a charging voltage that exceeds a voltage of the power supply.

3. The apparatus of claim 1 including a voltage booster to charge the energy storage device with a boosted voltage that exceeds a voltage of the power supply.

4. The apparatus of claim 1 including a recovery filter that is switchably coupled between the positive and negative rails, the control component engages the recovery filter when both the first and second switches are opened to stabilize the voltage at the first polarity and prevent the arc detection component from falsely detecting arcs.

5. An apparatus for arc handling, comprising:
a positive rail and a negative rail that are disposed to form an electrical link between a plasma chamber and a positive output and a negative output, respectively, of a power supply;

an arc detection component to detect an occurrence of an arc in the plasma chamber;

a voltage reversal component coupled across the positive rail and the negative rail, the voltage reversal component including:
an energy storage component switchably coupled between the positive rail and the negative rail;

a recovery filter that is switchably coupled between the positive and negative rails, the recovery filter is configured to stabilize a voltage between the positive and negative rails and prevent the arc detection component from falsely detecting arcs when the energy storage component is decoupled from between the positive rail and the negative rail;

a control component that is coupled to the arc detection component, the voltage reversal component, and the recovery filter, the control component is configured to couple the energy storage component across the positive and negative rails when an arc is detected to apply a negative potential of the energy storage component to the positive rail and a positive potential of the energy storage component to the negative rail, and the control component decouples the recovery filter from the positive and negative rails while the energy storage component is coupled across the positive and negative rails and recouples the recovery filter across the positive and negative rails when the arc is extinguished and the energy storage component is decoupled from the positive and negative rails.

6. The apparatus of claim 5, including:
a charging-power supply to charge the energy storage device to a charging voltage that exceeds a voltage of the power supply.

7. The apparatus of claim 5, including a voltage booster to charge the energy storage device with a boosted voltage that exceeds a voltage of the power supply.

* * * * *